United States Patent [19]
Yokoyama

[11] 4,349,786
[45] Sep. 14, 1982

[54] COMPLEMENTARY DIFFERENTIAL AMPLIFIER CIRCUIT HAVING SOURCE-FOLLOWER DRIVING CIRCUITS

[75] Inventor: Kenji Yokoyama, Hamamatsu, Japan

[73] Assignee: Nippon Gakki Seizo Kabushiki Kaisha, Hamamatsu, Japan

[21] Appl. No.: 203,512

[22] Filed: Nov. 3, 1980

[30] Foreign Application Priority Data

Nov. 15, 1979 [JP] Japan .................................. 54-158629

[51] Int. Cl.$^3$ ............................................. H03F 3/45
[52] U.S. Cl. .................................... 330/253; 330/267; 330/261
[58] Field of Search ................. 330/253, 261, 263, 267

[56] References Cited

U.S. PATENT DOCUMENTS 3,927,333 12/1975 Furuhashi ........................... 330/263

Primary Examiner—James B. Mullins
Assistant Examiner—Gene Wan
Attorney, Agent, or Firm—Frishauf, Holtz, Goodman and Woodward

[57] ABSTRACT

A complementary differential amplifier circuit in which a complementary differential amplifier having a first differential pair of first and second bipolar transistors of a first conductivity type and a second differential pair of third and fourth bipolar transistors of a second conductivity type is driven by source-follower circuits comprising a pair of input field effect transistors having their drains coupled together and a pair of source resistors having their first ends connected to the sources of the field effect transistors, respectively, and their second ends coupled together. A first constant voltage source or circuit such as a Zener diode is connected between the drains of the field effect transistors and the emitters of the third and fourth bipolar transistors, while a second constant voltage source or circuit is connected between the emitters of the first and second bipolar transistors and the second ends of the source resistors.

3 Claims, 3 Drawing Figures

COMPLEMENTARY DIFFERENTIAL AMPLIFIER CIRCUIT HAVING SOURCE-FOLLOWER DRIVING CIRCUITS

BACKGROUND OF THE INVENTION

This invention relates to a differential amplifier and, more particularly, to a complementary differential amplifier circuit with source-follower driving circuits.

In order to increase an input impedance of a differential amplifier comprised of bipolar transistors, source-follower driving circuits may be connected to the bases of differential bipolar transistors. With such a differential amplifier, if the drain-to-source voltage $V_{DS}$ of field effect transistors used in the source-follower driving circuits is fixed substantially constant irrespective of variations in supply voltage, then it will be possible to prevent distortion of a gate input signal which is caused by the variation in the input impedance resulting from the variation in gate-to-drain capacitance $C_{rss}$ which is caused by the variation in the drain-to-source voltage $V_{DS}$ and improve the stability of the differential amplifier against the variation in supply voltage, that is, the supply voltage rejection ratio (S.V.R.R.). A prior art differential amplifier, as shown in FIG. 1, arranged to hold the drain-to-source voltage $V_{DS}$ of source-follower field effect transistors substantially constant is known.

In the known differential amplifier of FIG. 1, to the bases of bipolar differential transistors 1 and 2 having their emitters coupled together are connected source-follower field effect transistors 3 and 4, respectively. The drain-to-source voltage of each of the field effect transistors 3 and 4 can be kept constant because of a constant voltage drop across a resistor 5 connected to the emitters of differential transistors 1 and 2, and a negligible variation of the base-to-emitter voltages of the transistors 1 and 2 which are caused by amplification of a signal, even if a supply voltage (between $+V$ and $-V$) fluctuates. The variations in the gate-to-drain voltage of each of the field effect transistors 3 and 4 are also negligible because the variations of the gate-to-source voltage of each of the field effect transistors 3 and 4 are negligible. Therefore, the circuit of FIG. 1 can improve the supply voltage rejection ratio and eliminate or reduce the distortion which is caused by variations in the drain-to-gate capacitance of the field effect transistors 3 and 4. Since such distortion as described above cannot be reduced by negative feedback in the differential amplifier used as a first-stage amplifier adapted for signal amplification, the reduction of distortion is very advantageous.

The prior art circuit of FIG. 1 has, however, a circuit configuration which is asymmetrical with respect to positive and negative supply voltages ($+V$, $-V$). Therefore, it is very difficult to derive output signals which are symmetrically biased to positive and negative DC voltages of a certain magnitude, restricting the flexibility of design for a subsequent amplifier stage.

SUMMARY OF THE INVENTION

It is an object of this invention to provide a complementary differential amplifier circuit having source-follower driving circuits in which the drain-to-source voltages of source-follower field effect transistors are kept substantially constant so that distortion of a gate input signal resulting from the variation in the drain-to-source voltage of the field effect transistors may be reduced and the supply voltage rejection ratio is improved.

It is another object of this invention to provide a complementary differential amplifier circuit having source-follower driving circuits which is constituted to be symmetrical with respect to positive and negative supply voltages.

In accordance with this invention, sources of first and second input field effect transistors having first and second source load resistors are connected to inputs of a complementary differential amplifier comprised of a first differential pair of first and second bipolar transistors of a first conductivity type having their emitters coupled together and a second differential pair of third and fourth bipolar transistors of a second conductivity type having their emitters coupled together. The first and second field effect transistors have their drains coupled together, and the first and second source resistors have their first ends connected to the sources of the first and second field effect transistors, respectively and their second ends coupled together. A first constant voltage source or circuit which may be comprised of a Zener diode supplied with a constant current through a constant current source is connected between the drains of the first and second field effect transistors and the emitters of the third and fourth bipolar transistors, while a second constant voltage source or circuit like the first constant voltage source or circuit is connected between the emitters of the first and second bipolar transistors and the second ends of the first and second source resistors.

DETAILED DESCRIPTION OF THE PREFERRED EMBODIMENT

Figure 1:
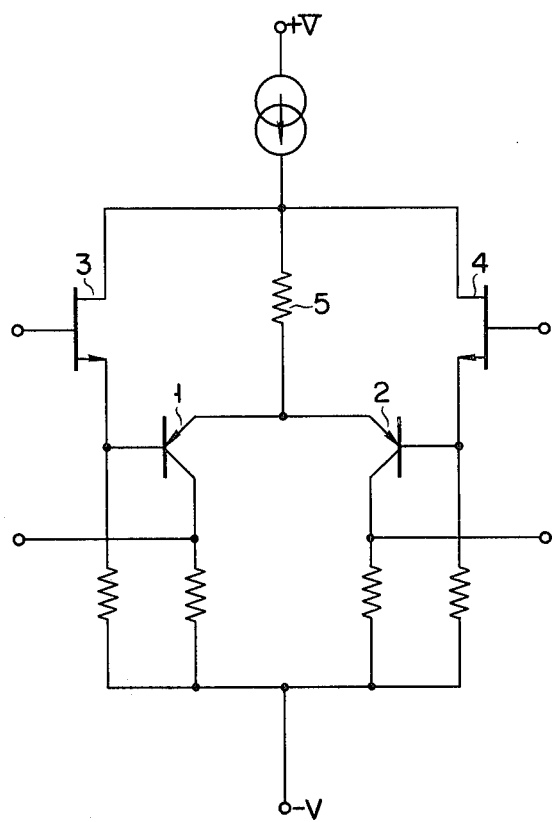
FIG. 1 is a schematic circuit diagram of a prior art differential amplifier circuit having source-follower driving circuits.
Figure 2:
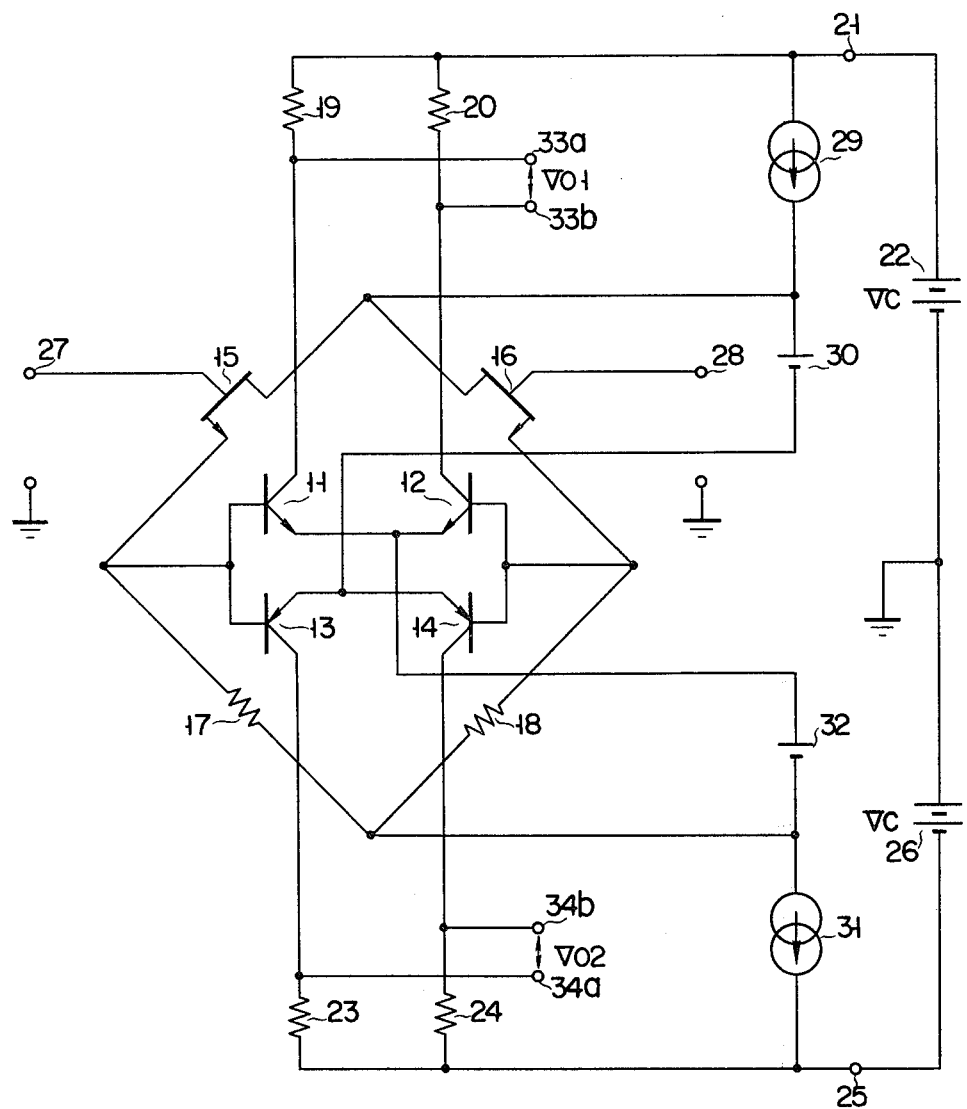
FIG. 2 shows a basic circuit arrangement of a complementary differential amplifier circuit having source-follower driving circuits according to this invention.

Referring now to FIG. 2, a basic circuit arrangement of a complementary differential amplifier circuit of this invention is illustrated which is adapted for signal amplification and comprised of a complementary differential amplifier including bipolar transistors 11 through 14, and source-follower driving circuits for applying an input signal to the complementary differential amplifier, which include field effect transistors 15 and 16 (P-channel type in this embodiment), respectively and source resistors 17 and 18 connected to the sources of field effect transistors 15 and 16, respectively.

More specifically, the bipolar transistors 11 and 12 are of NPN-type which have their emitters coupled together and their collectors connected respectively through collector resistors 19 and 20 to a positive power supply terminal 21 connected to a positive terminal of a DC power source 22 whose negative terminal is grounded, while the bipolar transistors 13 and 14 are of PNP-type which have their emitters coupled together and their collectors connected respectively through collector resistors 23 and 24 to a negative power supply terminal 25 connected to a negative terminal of a DC power source 26 whose positive terminal is grounded. The bipolar transistors 11 and 13 have their bases connected together to a connection point of the field effect transistor 15 and the resistor 17, while the bipolar transistors 12 and 14 have their bases connected together to a connection point of the field effect transistor 16 and the resistor 18.

The field effect transistors 15 and 16 have their gates connected respectively to input terminals 27 and 28 to which input signals are applied and their drains coupled together to the positive power supply terminal 21 through a constant current source 29.

A constant voltage source or circuit 30 is connected between the constant current source 29 or the drains of field effect transistors 15 and 16 and the emitters of PNP-type transistors 13 and 14.

The source resistors 17 and 18 with one end thereof connected to the sources of field effect transistors 15 and 16 have the other ends coupled together to the negative power supply terminal 25 through a constant current source 31.

A constant voltage source or circuit 32 is connected between the constant current source 31 and the emitters of NPN-type transistors 11 and 12.

With the amplifier circuit of FIG. 2, an output is derived from each collector of transistors 11 through 14. For example, an output signal $V_{01}$ may be taken from output terminals 33a and 33b connected to the collectors of bipolar differential transistors 11 and 12 and another output signal $V_{02}$ may be taken from output terminals 34a and 34b connected to the collectors of bipolar differential transistors 13 and 14. The output signals $V_{01}$ and $V_{02}$ are proportional in magnitude to the difference between input signal voltages which are applied to the input terminals 27 and 28, and opposite in phase to each other.

In the circuit of FIG. 2, since the constant voltage circuit 30 is supplied with a constant current by the constant current source 29, the voltage across the constant voltage circuit 30 is kept constant irrespective of variations in the supply voltage. Since the variations of base-to-emitter voltage of each transistor 13 and 14 which are caused by amplification of a signal are negligible, the voltage between the drains of field effect transistors 15 and 16 and the sources of field effect transistors 13 and 14 are also kept substantially constant. Accordingly, the gate-to-drain voltages of field effect transistors 15 and 16 vary to a very small extent because the variations in the gate-to-source voltage of each of the field effect transistors 15 and 16 due to the variations of an input signal voltage applied to the input terminals 27 and 28 is very small.

On the other hand, the voltage between the emitters of NPN-type differential transistors 11 and 12 and the connection point of the resistors 17 and 18 is kept constant by the constant voltage circuit 32 supplied with a constant current from the constant current source 31. Since the base-to-emitter voltages of differential transistors 11 and 12 vary to a very small extent during the signal amplification as in the case of the differential transistors 13 and 14, the voltages across the source resistors 17 and 18 remain substantially unchanged. This means that the drain currents of the field effect transistors 15 and 16 flowing through the source resistors 17 and 18 remain substantially unchanged.

As will be evident from the foregoing, according to this invention, the drain-to-source voltages and drain currents of the source-follower transistors 15 and 16 can be kept substantially constant even when the supply voltage changes and an input signal is applied, thereby improving the supply voltage rejection ratio. Further, since the gate-to-drain voltages of source-follower transistors 15 and 16 remain substantially unchanged during the signal amplification, the gate-to-drain capacitance $C_{rss}$ of source-follower transistors 15 and 16 can be kept substantially constant with the result that the distortion of an input signal resulting from the variation in the gate-to-drain capacitance $C_{rss}$ may be eliminated or reduced. As will be easily understood from the symmetrical circuit configuration of FIG. 2, the DC levels of output signals are symmetrical with respect to ground level so that the flexibility of design for the subsequent amplifier stage is obtained.

Figure 3:
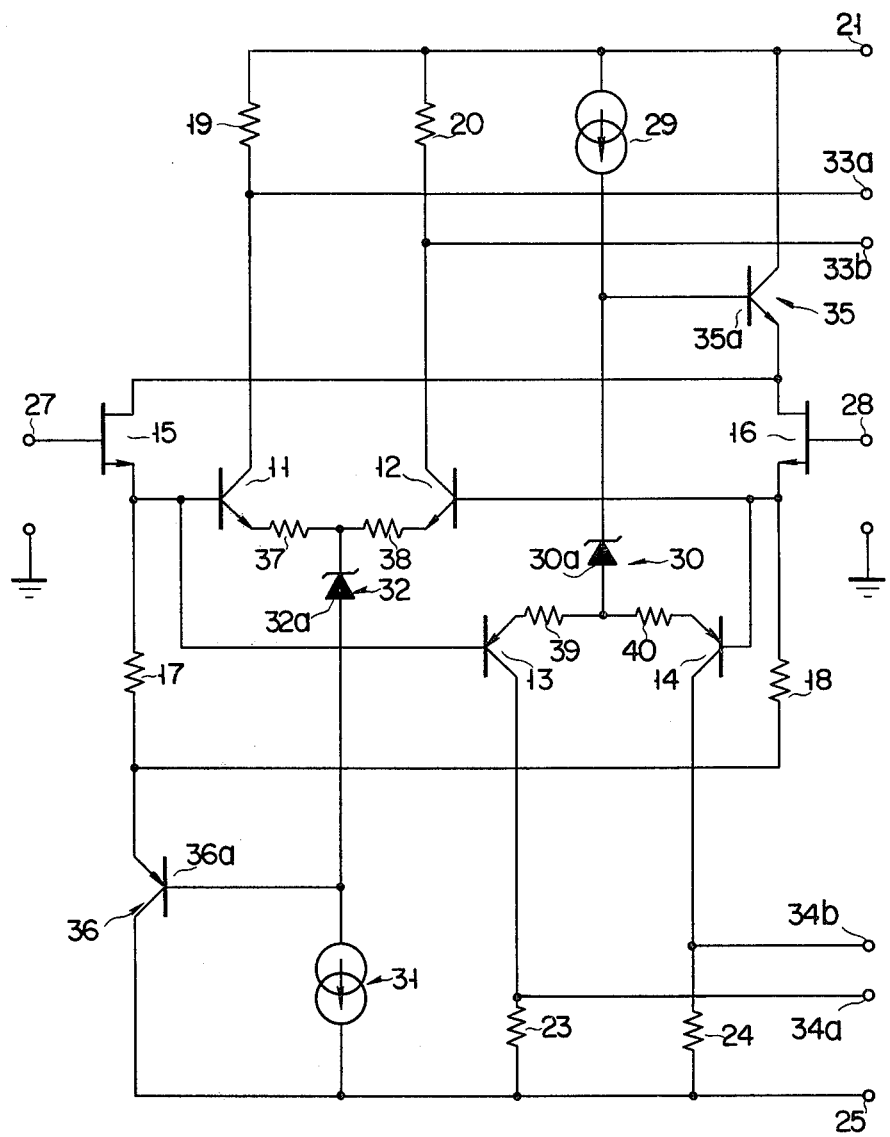
FIG. 3 shows a practical circuit arrangement of the complementary differential amplifier circuit of FIG. 2.

Referring to FIG. 3 there is shown a practical circuit arrangement of the complementary differential amplifier circuit of FIG. 2. In this figure, the same parts of those of FIGS. 2 are designated by the same reference numerals, the descriptions thereof being excluded. In this preferred embodiment of this invention, Zener diodes 30a and 32a are used as the constant voltage source or circuits 30 and 32 of FIG. 2, respectively. To couple potentials to the drains of transistors 15 and 16 and the connection point of the source resistors 17 and 18 voltage followers 35 and 36 are used.

More specifically, the voltage follower 35 is comprises of an NPN-type transistor 35a which has its collector connected to the positive power supply terminal 21, its emitter connected to the drains of field effect transistors 15 and 16, and its base connected to the connection point of the constant current source 29 and the Zener diode 30a. On the other hand, the voltage follower 36 is comprised of a PNP-type transistor 36a which has its collector connected to the negative power supply terminal 25, its emitter connected to the connection point of the source resistors 17 and 18, and its base connected to the connection point of the Zener diode 32a and the constant current source 31. The circuit of FIG. 3 may provide the same results as obtained in the circuit of FIG. 2. Emitter resistors 37 through 40 respectively connected to the emitters of transistors 11 through 14 may be removed if each differential pair of transistors have perfectly matched characteristic.

Though, in the circuits of FIGS. 2 and 3, the resistive collector load circuits are used in the differential amplifiers, current mirror circuits may be used instead.

What is claimed is:

1. An amplifier circuit comprising:
   first and second field effect transistors having their drains coupled together and their gates coupled respectively to first and second input terminals to which an input signal to be amplified is applied;
   first and second resistors having their first ends connected to sources of said first and second field effect transistors, respectively, and their second ends coupled together;
   a first differential pair of first and second bipolar transistors of a first conductivity type having their emitters coupled together and their bases connected to a first connection point of said first field effect transistor and said first resistor and a second connection point of said second field effect transistor and said second resistor, respectively;
   a second differential pair of third and fourth bipolar transistors of a second conductivity type having their emitters coupled together and their bases connected to said bases of said first and second bipolar transistors, respectively;

a first constant voltage circuit connected between said drains of said first and second field effect transistors and said emitters of said third and fourth bipolar transistors; and a second constant voltage circuit connected between said emitters of said first and second transistors and said second ends of said first and second resistors.

2. The amplifier circuit according to claim 1 further comprising a first constant current source connected between said first constant voltage circuit and a first power supply terminal; a first voltage follower connected between said drains of said first and second field effect transistors and a connection point of said first constant current source and said first constant voltage circuit; a second constant current source connected between said second constant voltage circuit and a second power supply terminal; and a second voltage follower connected between said second ends of said first and second resistors and a connection point of said second constant current source and said second constant voltage circuit.

3. The amplifier circuit according to claim 1 or 2 wherein said first and second constant voltage circuits each comprises a Zener diode.

* * * * *